(12) United States Patent
Hattori et al.

(10) Patent No.: US 6,680,536 B2
(45) Date of Patent: Jan. 20, 2004

(54) PROBE UNIT HAVING RESILIENT METAL LEADS

(75) Inventors: Atsuo Hattori, Iwata (JP); Shuichi Sawada, Hamamatsu (JP); Masahiro Sugiura, Hamamatsu (JP); Yoshiki Terada, Hamamatsu (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 10/106,210

(22) Filed: Mar. 27, 2002

(65) Prior Publication Data

US 2002/0142509 A1 Oct. 3, 2002

(30) Foreign Application Priority Data

Mar. 28, 2001 (JP) .......................... 2001-092645

(51) Int. Cl.⁷ .............................. H01L 23/48
(52) U.S. Cl. ................ 257/739; 257/773; 257/776; 438/14; 438/52
(58) Field of Search ............. 438/14, 52, 17, 438/48; 257/739, 773, 776, 784

(56) References Cited

U.S. PATENT DOCUMENTS

| 6,221,750 B1 | * | 4/2001 | Fjelstad ................ 438/611 |
| 6,482,013 B2 | * | 11/2002 | Eldridge et al. .......... 439/66 |
| 6,499,216 B1 | * | 12/2002 | Fjelstad ................. 29/842 |

FOREIGN PATENT DOCUMENTS

| JP | 2-176570 | | 7/1990 |
| JP | 4-363671 | | 12/1992 |
| JP | 8-220140 | | 8/1996 |
| JP | 11-133062 | * | 5/1999 |
| JP | 11-237406 | | 8/1999 |

* cited by examiner

Primary Examiner—Caridad Everhart
(74) Attorney, Agent, or Firm—Dickstein, Shapiro, Morin & Oshinsky, LLP.

(57) ABSTRACT

A probe unit has a plurality of metal leads regularly juxtaposed on the surface of a substrate. Each metal lead has a resilient contact piece in a front portion of the lead, the resilient contact piece being spaced apart from the substrate surface or extending over an edge of the substrate. The cross sectional shape of the resilient contact piece is an arc shape and/or has a projection near at the distal end of the resilient contact piece.

14 Claims, 13 Drawing Sheets

PROBE UNIT HAVING RESILIENT METAL LEADS

CROSS REFERENCE TO RELATED APPLICATION

This application is based on and claims priority of Japanese patent application No. 2001-92645, filed on Mar. 28, 2001, the whole contents of which are incorporated herein by reference.

BACKGROUND OF THE INVENTION

A) Field of the Invention

The present invention relates to a probe unit to be used for a conduction test of an electronic component such as a semiconductor integrated circuit and a liquid crystal panel by making the probe unit in contact with the electrodes or terminal unit of the electronic component.

B) Description of the Related Art

Electronic components such as large scale semiconductor integrated circuits (LSI), liquid crystal panels and printed circuit boards are generally subjected to a conduction test in order to check whether electronic components operate normally in the manner written in the specification. LSI is formed on a silicon substrate. A liquid crystal panel is formed by using a pair of glass substrates. A printed circuit board is formed on a fiber reinforced plastic (FRP) substrate or a polyimide substrate. On these substrates a plurality of electrodes are formed being juxtaposed.

The conduction test is performed by pushing elastic or resilient beams in the front portions of leads of a probe unit against the electrodes on the substrate of an electronic component.

There is a tendency that a pitch of electrodes is becoming finer. A pitch of resilient beams of a probe unit is required to be correspondingly finer.

The pitch of electrodes is presently 0.1 mm or narrower. It is difficult to form a probe unit having such a pitch by a mechanical punching work. Etching or plating has been adopted to form such a probe unit.

For example, JP-A-11-133062 discloses a probe card having leads with contact terminals disposed along the principal surface of the substrate and extending over the edge of the substrate. These leads are coupled to the substrate via a holder unit having a predetermined height. A contact terminal of quadrilateral pyramids is disclosed.

JP-A-8-220140 proposes: a probe card having conductive projections of a pyramid shape having a pointed tip; and a method of manufacturing a probe card by forming a projection by transferring a projection formed by a mold, or fixing a fine conductive wire to a substrate and thereafter cutting the wire.

JP-A-4-363671 proposes a probe board which is manufactured by forming projecting contacts on the end portions of wiring patterns formed on a flexible wiring board, forming resilient members on the bottom surface of the board, and forming slits through the board to separate each of the wiring patterns. The projecting contact has a pointed tip directed toward a contact unit.

JP-A-11-237406 discloses a plated test probe to be made in electrical contact with a solder ball on an integrated circuit device.

JP-A-2-176570 proposes a probe card whose end portions are made in contact with electrodes and has a recess into which the electrodes are inserted.

SUMMARY OF THE INVENTION

It is an object of the present invention to provide a probe unit and its manufacture method capable of efficiently inspecting the conduction characteristics of a highly integrated electronic component.

It is another object of the present invention to provide a probe unit and its manufacture method suitable for inspecting parallel wiring lines of an electronic component and capable of dealing with some position misalignment of the probe unit, without damaging the wiring lines during inspection and without damaging probes during manufacture.

According to one aspect of the present invention, there is provided a probe unit comprising: a substrate having an insulated surface; and a plurality of metal leads regularly juxtaposed on the insulated surface of the substrate, the metal lead having a resilient contact piece in a front portion of the lead, the resilient contact piece being spaced apart from the insulated surface or extending over an edge of the substrate, and a vertical cross sectional shape of the resilient contact piece along a longitudinal direction of the metal lead having a portion curved in an arc shape.

According to another aspect of the present invention, there is provided a probe unit comprising: a substrate having an insulated surface; a plurality of metal leads regularly juxtaposed on the insulated surface of the substrate, the metal lead having a resilient contact piece in a front portion of the lead, the resilient contact piece extending over an edge of the substrate; and a projection formed on a surface of the resilient contact piece at a distal end thereof, the projection protruding from the surface of the resilient contact piece toward a direction opposite to the substrate and having a surface shape constituting a portion of a sphere.

According to a further aspect of the present invention, there is provided a probe unit comprising: a substrate having an insulated surface; a plurality of metal leads regularly juxtaposed on the insulated surface of the substrate, the metal lead having a resilient contact piece in a front portion of the lead, the resilient contact piece extending over an edge of the substrate; and a plurality of small projections formed on a surface of the resilient contact piece near at a distal end thereof on a side opposite to the substrate, the small projections having the same shape.

According to a still further aspect of the present invention, there is provided a probe unit comprising: a substrate having an insulated surface; a plurality of metal leads regularly juxtaposed on the insulated surface of the substrate, the metal lead having a resilient contact piece in a front portion of the lead, the resilient contact piece extending over an edge of the substrate; and two projections formed on a surface of the resilient contact piece near at a distal end thereof, in symmetry with a center line of the metal lead along a longitudinal direction thereof, the two projections becoming higher at a position nearer to the edge of the resilient contact piece and having a shape that the projections become higher and skirts of the projections become nearer, from the distal end to a side of the substrate at least up to an intermediate position.

If the resilient contact piece is spaced apart from the substrate, the resilient contact piece can be curved toward the substrate side when the resilient contact piece is pushed against the electrode to be inspected. It is possible to prevent an excessive force from being applied to the electrode, and the electrode is rarely damaged.

If the resilient contact piece is formed curving in an arc shape, stress of the resilient contact piece can be easily controlled.

A plurality of juxtaposed resilient contact pieces can be pushed at the same time against a plurality of electrodes disposed at the end of an electronic component such as an integrated circuit device. This probe unit is suitable for inspecting juxtaposed wiring leads.

An uniform load can be applied to each resilient contact piece at a predetermined bending amount.

A dot can be formed integrally with the resilient contact piece near at its front end portion. It is rare that only the dot is missed.

If the dome-shaped projection is formed at the front portion of the resilient contact piece, the resilient contact piece pushing an electrode hardly damages plated gold or copper wiring leads because the resilient contact piece has no edge.

If a dome-shaped or elongated small dot is formed on both sides of the resilient contact piece, the contact positions of the electrode and resilient contact piece can be automatically corrected from the displaced contact positions.

DESCRIPTION OF THE PREFERRED EMBODIMENTS

Figure 1A:
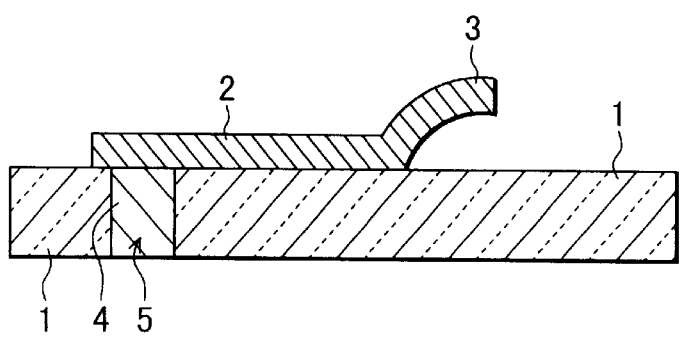
FIGS. 1A, 1B, 1C and 1D are schematic cross sectional views showing examples of a curved resilient contact piece in a front portion of a lead formed on a substrate, the resilient contact piece extending over the edge of the substrate.

Description will be made on the preferred embodiments of the invention, referring to the drawings. FIGS. 1A, 1B, 1C and 1D are cross sectional views showing examples of the structure of a probe unit.

As shown in FIG. 1A, a metal lead 2 is disposed on the surface of a substrate 1, a front portion of the metal lead extends above the surface of the substrate to form a resilient contact piece 3.

The substrate 1 may be any one of a glass plate, a ceramic plate, a synthetic resin plate, a silicon plate and a metal plate. If an electroconductive substrate such as a metal plate is used, an insulating layer is formed on the surface where leads are to be formed.

A number of metal leads 2 are regularly disposed on the surface of the substrate 1.

The metal leads may be disposed in parallel or regularly at predetermined angles.

The resilient contact piece 3 of each metal lead 2 is formed in the front portion of the lead along the longitudinal direction. A plurality of resilient contact pieces are disposed at the same position in the longitudinal direction or at regularly changing different positions, respectively with the same shape and size. The position, shape and length of each resilient contact piece may be changed in various ways.

The metal lead 2 has generally a uniform thickness over the whole length thereof, both in a portion contacting the substrate 1 and in a portion of the resilient contact piece spaced apart from the substrate 1. The resilient contact piece 3 spaced apart from the surface of the substrate 1 extends in a smooth arc shape and has its distal end near at the remotest point from the surface of the substrate 1. The position near at the remotest point is a position capable of providing the same function as that at the remotest point.

The planar shape of the distal end of the resilient contact piece 3 may be angled like a rectangle, rounded like a semicircle, or a rectangle whose corners are rounded. It is preferable that the metal lead 2 has a proper rigidity and elasticity. The metal lead is preferably made of Ni, Ni—Fe alloy, Ni—W alloy or metal glass. The thickness of the metal lead 2 is preferably about 10 to 80 μm in order to give a proper strength and elasticity.

The probe unit may have a small projection near at the distal end of each resilient contact piece 3. The shape of the dot is not limited to a particular one.

Figure 1B:
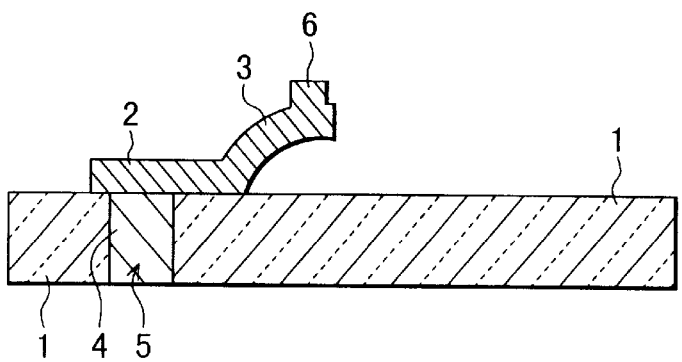
Figure 1C:
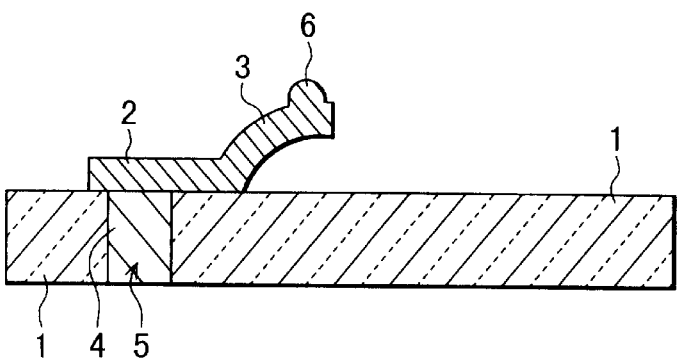

FIG. 1B shows an example of a small projection 6 formed on a resilient contact piece 3 near at the distal end on the surface opposite to the substrate 1. FIG. 1C shows an example of a small projection of an arc shape whose radius of curvature is smaller than that of the resilient contact piece 3, or preferably the small projection has a semisphere shape. These projections are made of the same material as that of the metal lead 2 or of a different material. If a different material is to be used, metals having affinity are used. The metal has preferably a proper rigidity.

Figure 1D:
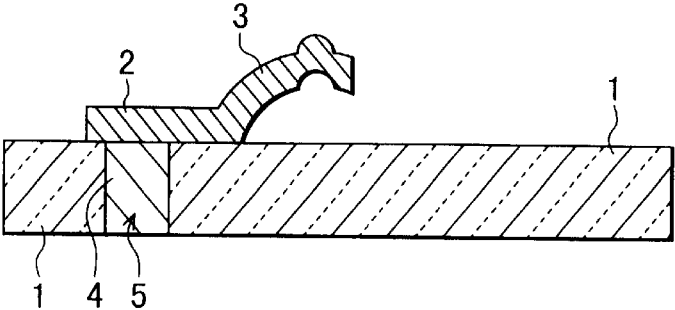

As shown in FIG. 1D, an upward curved resilient contact piece 3 may have a small projection on the top surface (remotest from the substrate) of the resilient contact piece, the small projection being curved at a smaller radius of curvature than the resilient contact piece.

As shown in FIGS. 1A to 1D, a through hole 5 may be formed through the substrate 1 where each metal lead 2 contacts the substrate to fill a metal via 4 in the through hole 5. In this case, a signal (current) flowing through the metal lead 2 can be picked up at the bottom surface of the substrate.

Since the resilient contact piece 3 is spaced apart from the substrate 1, the resilient contact piece 3 is curved toward the substrate at a proper elasticity when the piece is abutted on an electrode to be inspected. Since an excessive force is not applied to the electrode, it is rare to damage the electrode. Since the resilient contact piece is curved in an arc shape and has generally a uniform thickness, it is easy to control stress.

If the resilient contact pieces disposed in parallel have the same shape and size and are disposed at the same position along the longitudinal direction of the metal lead 2, the resilient contact pieces of the probe can be pushed at the same time against a number of electrodes juxtaposed at the end of, for example, an integrated circuit, and a uniform load can be applied to each resilient contact piece at a predetermined bending force. It is possible to prevent only some resilient contact pieces from being pushed strongly against the electrodes.

The resilient contact pieces are generally directed toward a sample to be inspected. If the metal via 4 formed through the substrate 1 is provided to pick up a signal on the lead 2 from the bottom surface of the substrate, lead wire electrodes, insulating films between lead wire electrodes and the like can be formed on the bottom surface of the substrate instead of the front surface thereof.

Figure 2C:
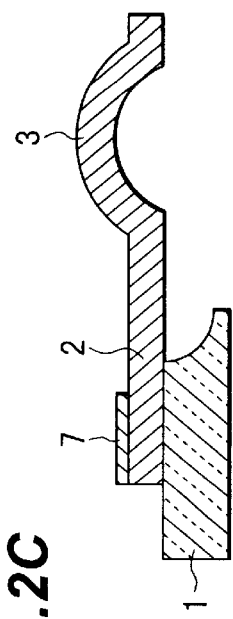
FIGS. 2A, 2B and 2C are a plan view and cross sectional views showing examples of a resilient contact piece extending over the edge of a substrate, the resilient contact piece having a curved front portion.
Figure 2D:
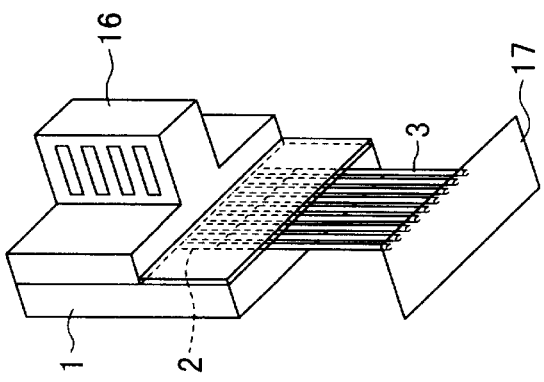
FIG. 2D is a perspective view illustrating how a probe unit is used.
Figure 2A:
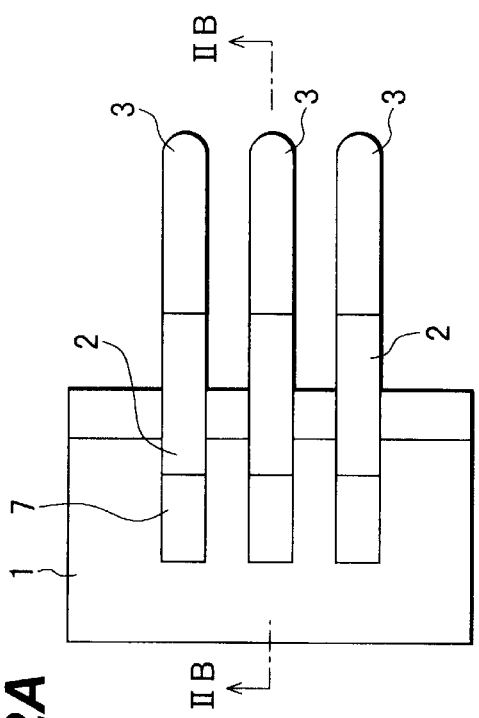

FIG. 2A shows an example of a probe unit in which a plurality of metal leads 2 regularly disposed in parallel on the surface of a substrate extend outwardly over the edge of the substrate 1.

Figure 2B:
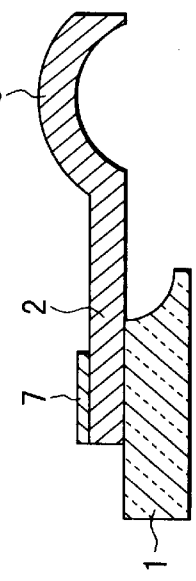

As shown in FIG. 2A, one end 3 of the metal lead 2 protrudes outwardly over the edge of the substrate 1. The cross sectional shape of the front portion 3 may be an arc shape as shown in FIG. 2B or may have an arc shaped intermediate portion in a straight beam as shown in FIG. 2C.

In this probe unit, a plated pad 7 of gold or lamination of gold and platinum may be formed on an end portion of the lead 2 opposite to the resilient contact piece 3. A thickness of the plated pad 7 is preferably about 4 to 5 $\mu$m.

The lead 2 in tight contact with the substrate 1 near at the plated pad may be covered with a protective film to enhance the tight contactness of the lead 2 to the substrate 1 (prevention of lead peel-off) and to prevent electric shortage between leads.

These resilient contact pieces have the characteristics similar to those of the resilient contact pieces of the probe unit described earlier, and can be used in the similar manner. Instead of directing the probe unit in a horizontal posture toward the component to be inspected, the probe unit is set upright to push downward the distal ends of the resilient contact pieces against the electrodes of a component such as an integrated circuit.

FIG. 2D is a diagram illustrating how the probe unit is used by setting it upright. A connector 16 connected to the metal leads is mounted on the probe unit, and the resilient contact pieces are pushed downward to measure the component 17.

The resilient contact pieces are pushed downward against the electrodes of an integrated circuit by setting one end of the probe unit along the longitudinal direction perpendicular to the surface of the integrated circuit substrate. Since the resilient contact piece 3 has a bending portion, it is deformed by stress so that the probe is given elasticity.

By providing the plated pads, the electrical resistance between the probe and external wiring lines can be lowered, and reliability of attachment of solder plating or anisotropically conductive film can be improved.

FIGS. 3A, 3B, 3C and 3D are plan views and cross sectional views showing examples of a probe unit according to another embodiment of the invention.

Figure 3A:
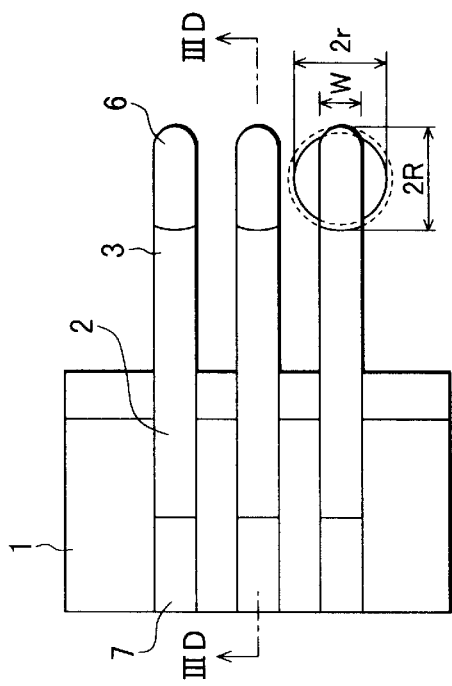
FIGS. 3A, 3B, 3C and 3D are plan views and cross sectional views showing examples of a resilient contact piece having a dome-shaped projection in the front portion.
Figure 3B:
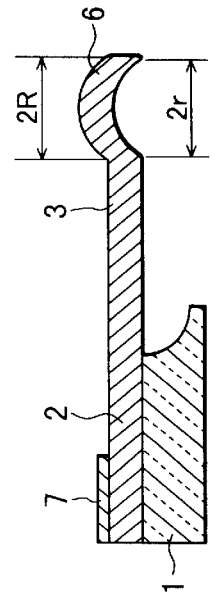
Figure 3C:
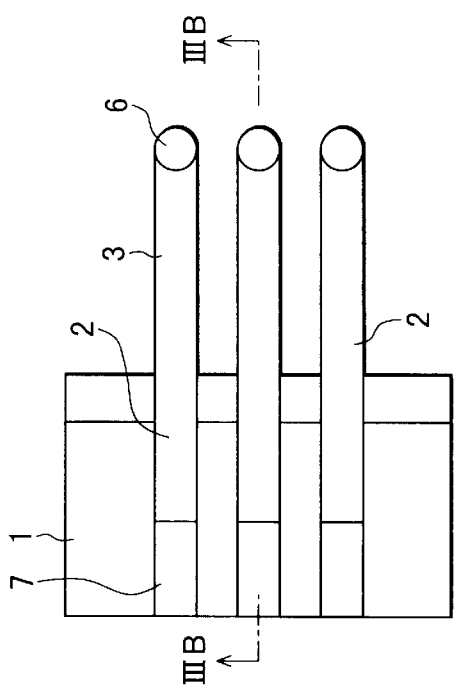
Figure 3D:
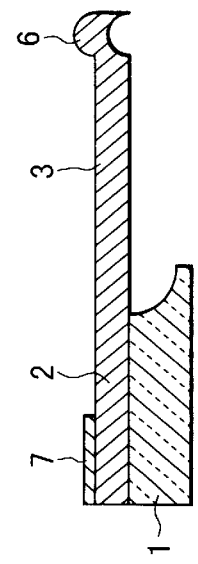

Referring to FIG. 3A, a resilient contact piece 3 extends over the edge of a substrate 1. A dome-shaped projection (forming part of a sphere) 6 is formed at the distal end of a resilient contact piece 3 of the probe. In the example shown in FIG. 3A, the diameter of a sphere is equal to the width of the lead 2, and in the example shown in FIG. 3C, the diameter 2R of a circle obtained by cutting a sphere along a plane defined by the lead upper surface is greater than the width W of the lead 2. As shown in FIGS. 3B and 3D, the projection 6 of the resilient contact piece 3 has a cross sectional shape which makes the lead 2 bend upward. In FIG. 3D, 2r is a diameter of a circle obtained by cutting the spherical surface of a concave portion by a plane defined by the bottom surface of the lead 2 (substrate surface). The projection on the upper surface of the resilient contact piece is a portion of a spherical surface including a circle having the diameter 2R, and the concave portion under the resilient contact piece is a portion of a spherical surface including a circle having the diameter 2r. Both the spherical surfaces have generally the same center.

The relation between 2R and W is preferably 2R>W, and the relation between 2r and W is preferably 2r>W. For example, if W is 25 $\mu$m, 2R may be 60 $\mu$m and 2r may be 40 $\mu$m. Other values may also take.

In FIGS. 3A to 3D, a hollow is formed under the dome-shaped projection 6. Although the distal end portion has a dome-shaped projection, the hollow may not be formed.

With this probe unit, a conduction test is performed by pushing the dome-shaped projections 6 against the electrodes of a component to be inspected. Since the dome-shaped projections are used, corners are rarely abutted on the electrodes so that the electrodes are hardly damaged.

If the resilient contact piece itself has edges or if the projection and curved portion of the resilient contact piece have edges, and if the edges are pushed against the electrodes of a component to be inspected, because of some position misalignment of the probe and electrode, the plated gold or copper wiring leads of the electrodes may be damaged. If the flat or curved portions of the resilient contact piece is abutted on the electrode, the electrode will not be damaged. Since the dome-shaped projections without any edge are formed at the end of the probe as in this embodiment, the plated gold or copper wiring leads of the electrodes will not be damaged even if an integrated circuit substrate has an irregular surface, even if the substrate is slanted, or even if the probe and electrodes are misaligned.

If the relations of 2R, 2r and W satisfy the above-described conditions, the gold plated copper wiring lead will not be damaged, a sufficient contact area can be obtained, and a contact resistance can be lowered.

Figure 4A:
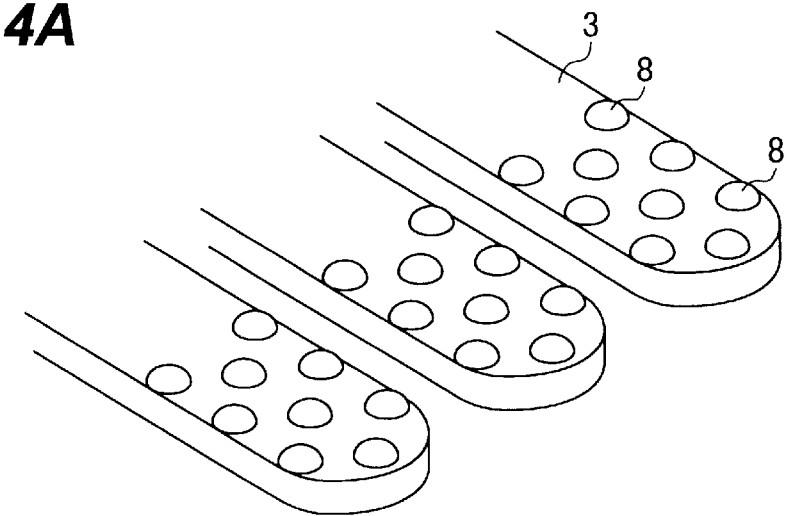
FIGS. 4A, 4B and 4C are perspective views showing examples of a resilient contact piece having a plurality of small dots on the surfaces thereof.
Figure 4B:
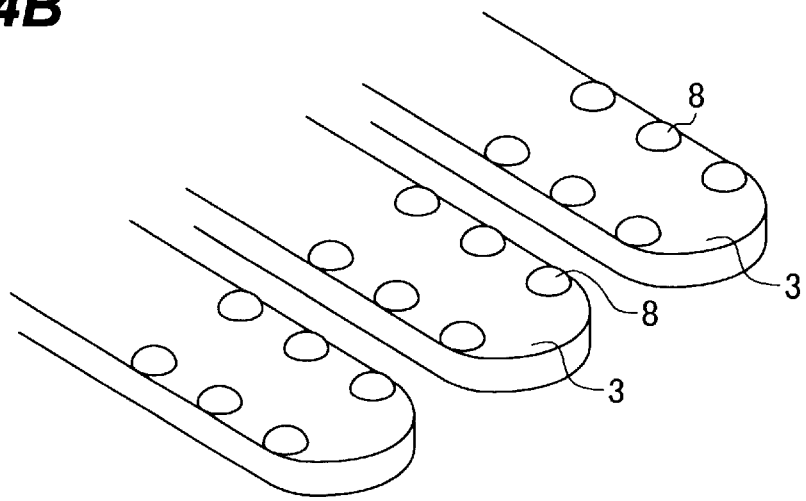
Figure 4C:
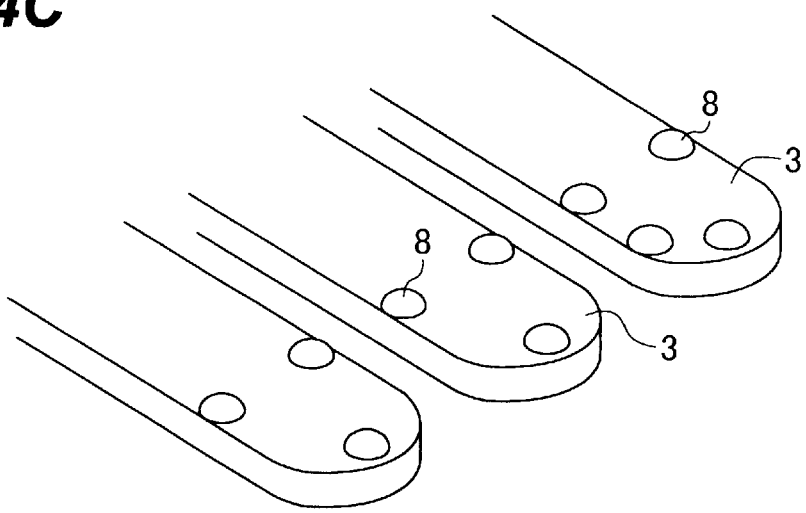

FIGS. 4A, 4B and 4C show examples of a resilient contact piece 3 having a plurality of small dots of the same shape formed on the distal end portion of the resilient contact piece 3. In the examples shown in FIGS. 4A to 4C, a small dot 8 has a shape of a partial sphere, i.e., a dome-shaped small dot. In the examples shown in FIGS. 5A, 5B and 5C, instead of a sphere, a semicylindrical small dot 8 is used. This small dot 8 has a shape obtained by cutting a cylinder in parallel to its axis, the cut surface being in contact with the surface of the resilient contact piece. In these embodiments, the shape of the distal end of the resilient contact pieces 3 is semicircle in the plane parallel to the surface of the resilient contact piece 3. The shape is not limited only to a semicircle.

In the example shown in FIG. 4A, dome-shaped small dots are disposed in three rows, in the central area and near at the opposite sides along the lead width direction. In the example shown in FIG. 4B, dome-shaped small dots are disposed in two rows near at the opposite sides. In the example shown in FIG. 4C, dome-shaped small dots 8 are disposed at three positions, in the central area near at the distal end of the resilient contact piece 3 and near at the opposite sides near the distal end.

Figure 5A:
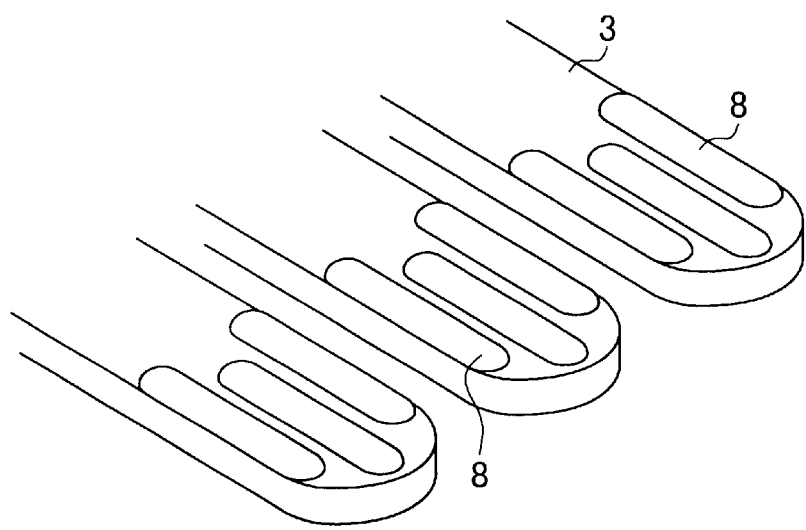
FIGS. 5A, 5B and 5C are perspective views showing other examples of a resilient contact piece having a plurality of small elongated dots on the surfaces thereof.

In the example shown in FIG. 5A, semicylindrical small dots 8 are disposed in the central area and near at the opposite sides near the distal end along the width direction of the lead 2. In the example shown in FIG. 5B, semicylindrical small dost 8 are disposed at the opposite sides. In the examples shown in FIGS. 5A and 5B, the longitudinal direction of the semicylindrical small dots 8 is disposed in parallel to the longitudinal direction of the metal lead 2. In the example shown in FIG. 5C, a plurality of semicylindrical small dots are disposed with their longitudinal direction being set perpendicular to the longitudinal direction of the lead.

Electrodes of a component to be inspected have generally a trapezoidal cross section having a flat upper surface and the side walls increasing its width toward the substrate. When a component is inspected by abutting the resilient contact pieces on the electrodes having such a shape and if only one large projection is formed on each resilient contact piece, there is no problem if the front end of the projection abuts on the upper flat surface of the electrode, even if the positions of the probe and electrode are displaced to some degree. However, if the projection displaces from the upper flat surface of the electrode, the probe may slips down on the electrode side wall.

However, if a plurality of small dots 8 are formed in the distal end area of the resilient contact pieces 3, it is possible to prevent the probe from slipping down on the side wall of the electrode if other small dots ride on the upper flat surface of electrodes even if the probe distal end portion displaces along a direction perpendicular to the lead longitudinal direction.

Figure 5B:
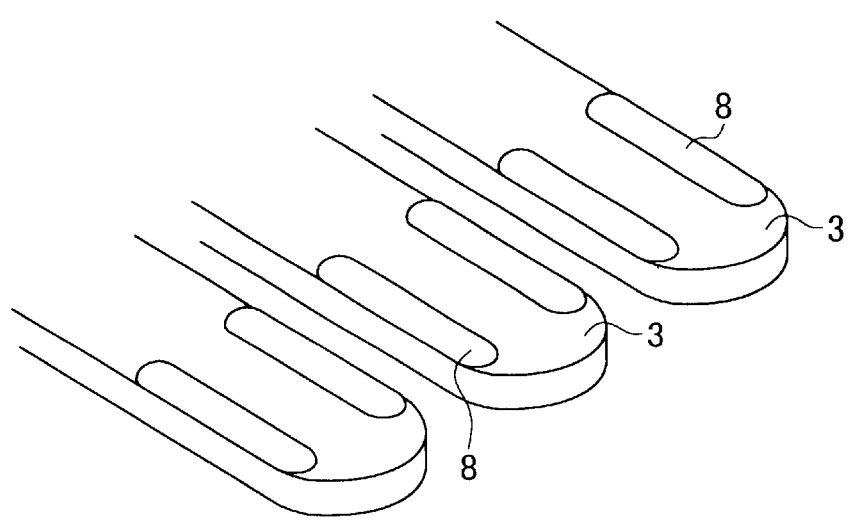
Figure 5C:
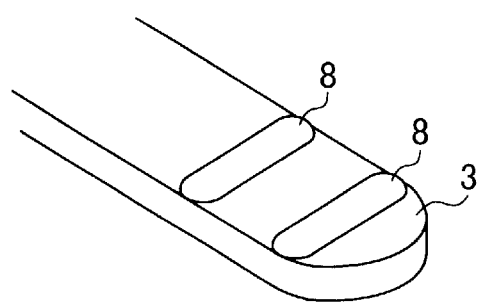

Good contact between the probe and electrodes is possible even if the probe distal end portion displaces along the lead longitudinal direction, in the case as shown in FIGS. 5A and 5B that the small dots 8 are semicylindrical and the longitudinal direction is parallel to the lead longitudinal direction, in the case as shown in FIG. 5C that the small dots are semicylindrical and the longitudinal direction is perpendicular to the lead longitudinal direction, and in the case as shown in FIGS. 4A and 4B that a plurality of dome-shaped small dots are disposed along the lead longitudinal direction.

Figure 6A:
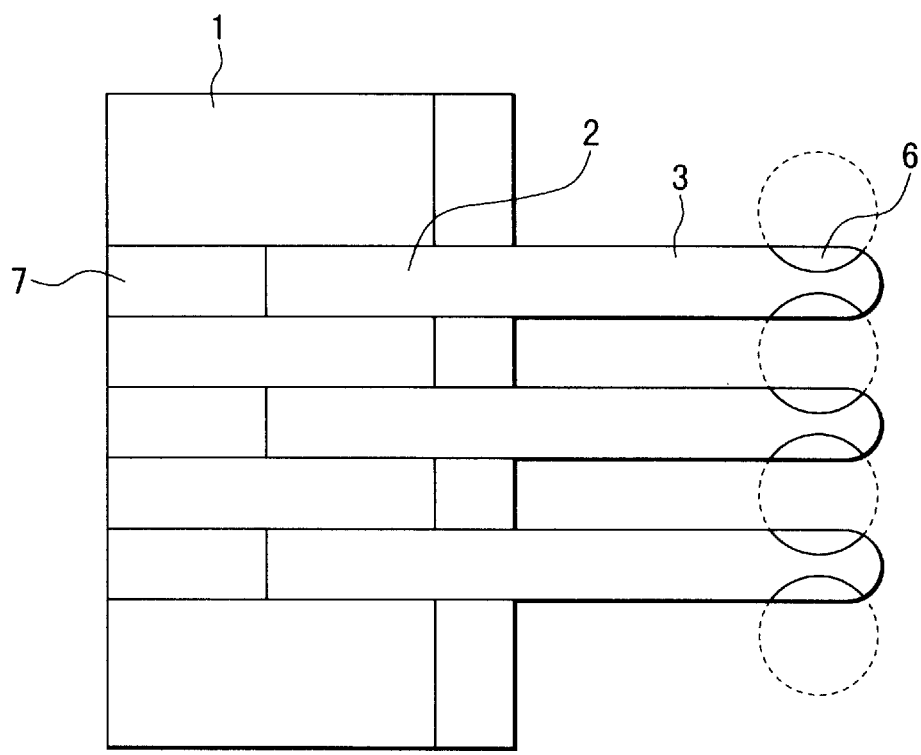
FIGS. 6A and 6B are a plan view and a side view showing an example of a resilient contact piece having projections on both sides of the distal end of the resilient contact piece.
Figure 6B:
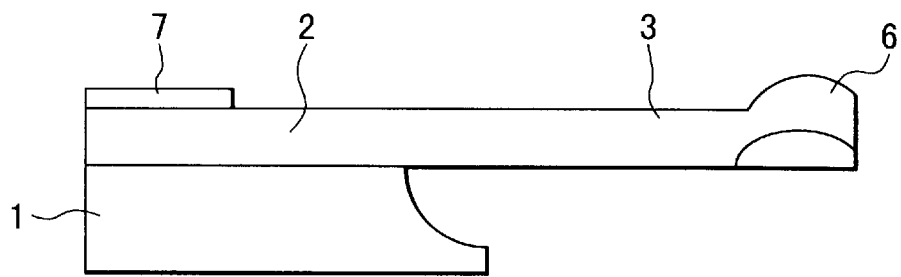
Figure 7A:
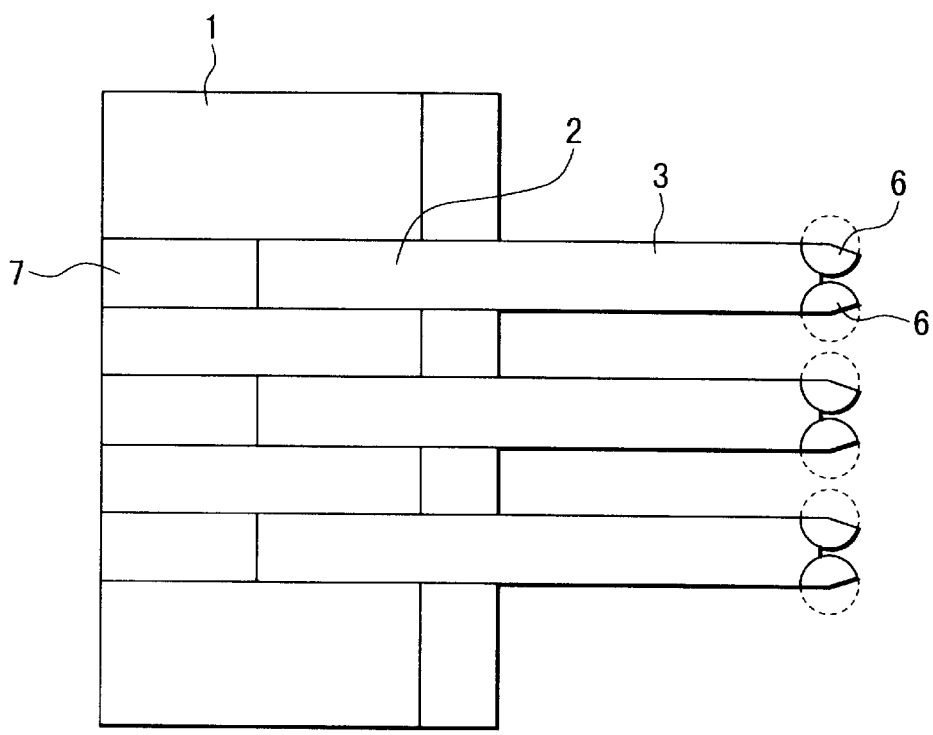
FIGS. 7A and 7B are a plan view and a side view showing another example of a resilient contact piece having projections on both sides of the distal end of the resilient contact piece.
Figure 7B:
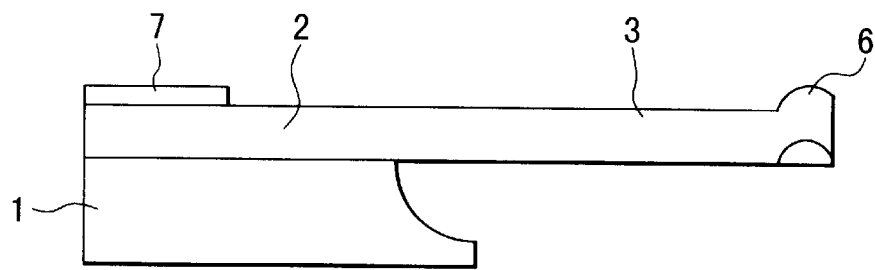

FIGS. 6A and 6B are a plan view and a side view showing another embodiment of the invention. FIGS. 7A and 7B are a plan view and a side view showing an example of another structure.

Projections 6 are formed on both sides of a resilient contact piece 3 at the distal end, the resilient contact piece 3 extending over the edge of a substrate 1. The projection 6 has a shape that the lead is pushed upward along a portion of a virtual spherical surface indicated by a broken line. In other words, it has a shape that it includes a portion of a dome-shaped projection.

Therefore, the projection 6 becomes higher at a nearer position to the center of the virtual circle shown by the broken line, and the skirts of the projections on both sides become nearer to each other at least up to the intermediate position along a line from the central distal end of the resilient contact piece 3 toward the proximal end.

In the example shown in FIG. 6A, the distal end of the resilient contact piece 3 is circular.

In the example shown in FIG. 7A, the distal end of the resilient contact piece 3 is constituted of the skirts of two projections 6. The distal end retracts in conformity with the shape of the skirts of the projections 6 until the projections become nearest, and retracts further from the nearest position to form a U-character shaped dent. In the distal end shape shown in FIGS. 7A and 7B, it is preferable that the distance between two projections is relatively narrow.

In the examples shown in FIGS. 6B and 7B, a dent corresponding to the projection 6 is formed under the projection at the distal end portion of the resilient contact piece. The lead 2 including the projections 6 has generally a uniform thickness, which is easy to fabricate. This dent may not be formed. A fabrication method of forming the projections 6 on the lead 2 may be adopted.

If the width of the upper flat surface of an electrode of a trapezoidal shape is narrower than the distance between the projections at the distal end portion of the resilient contact piece, the flat surface (flat valley surface) between projections becomes in contact with the upper flat surface of the electrode. If the probe distal end displaces laterally, the side of the upper flat surface of the electrode abuts on the wall of the projection. As the probe is further pushed against the electrode, a force which moves the probe laterally is generated so that the distal end of the probe is moved to make the upper flat surface of the electrode be in contact with the flat valley surface of the probe, as in the normal case. In this manner, an inspection method capable of automatically correcting a position displacement can be realized.

If the width of the upper flat surface of an electrode of a trapezoidal shape is wider than the distance between the projections at the distal end portion of the resilient contact piece, the curved side walls of the two projections abut on the opposite sides of the upper flat surface of the electrode to realize a stable normal contact. If the probe distal end displaces laterally, one side of the upper flat surface of the electrode abuts on the wall of one projection. As the probe is further pushed against the electrode, a force which moves the probe laterally is generated so that the distal end of the probe is moved to make both sides of the upper flat surface of the electrode be in contact with the curved side walls of the projections as in the normal case. Also in this manner, an inspection method capable of automatically correcting a position displacement can be realized.

Each of the leads described above can use the same material and can set the same thickness as those of the embodiments described earlier. The width and pitch of juxtaposed leads and the length of a resilient contact piece can be selected properly in accordance with the electrode layout of a component such as an integrated circuit to be inspected.

In each of the probe units described above, a wiring lead is connected to the surface of each lead on the side opposite to the lead resilient contact piece, or to the metal via connected to the lead surface through the substrate. This wiring lead can be connected by a wiring process used by a usual probe unit.

It is obvious that the structure common to the embodiments described earlier provides similar effects to be given by the structure.

Figure 8A:
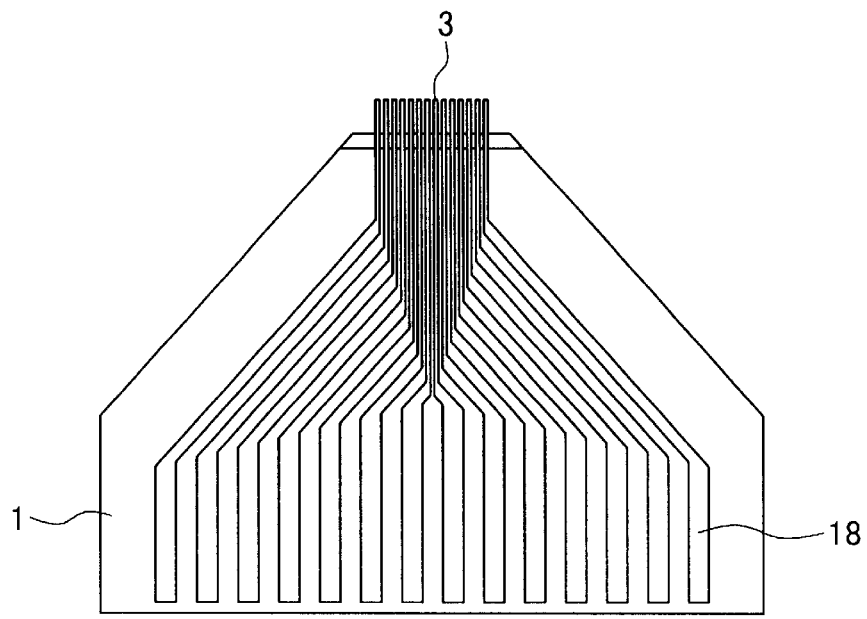
FIGS. 8A and 8B a plan view showing the shape of a probe unit and a perspective view illustrating how the probe unit is used.
Figure 8B:
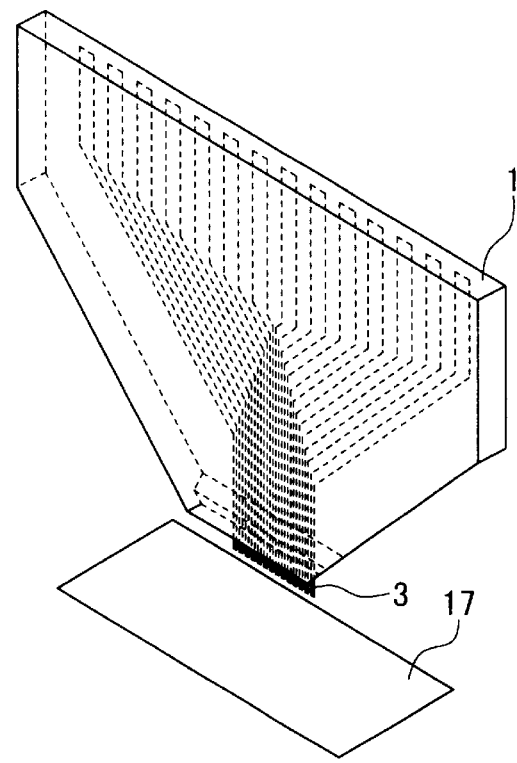

FIG. 8A is a plan view showing an example of a probe unit, and FIG. 8B is a perspective view illustrating how the probe unit is used. In FIG. 8A, reference numeral 18 represents a wiring lead, and in FIG. 8B, reference numeral 17 represents a component to be inspected.

Next, a method of manufacturing a probe unit of each of the above-described embodiments will be described.

Figure 9A:
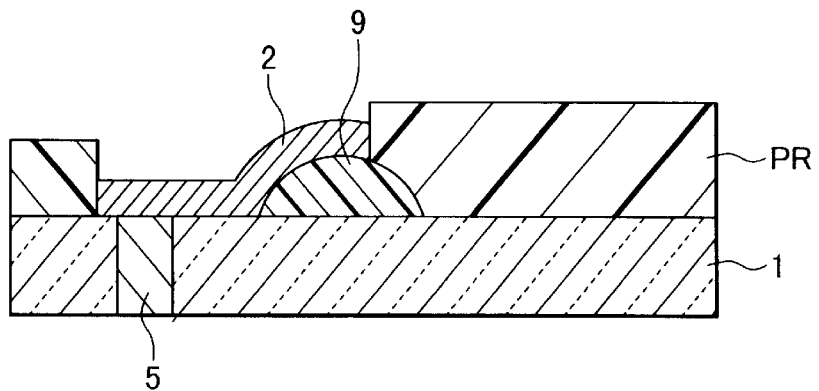
FIGS. 9A, 9B and 9C are cross sectional views illustrating several methods of forming a resilient contact piece.

As shown in FIG. 9A, a bumping bar 9 is formed on a substrate 1 at a predetermined position by using resist, low melting point glass such as PSG, BSG and BPSG, or refractory metal such as Pb, Sn and In.

The substrate may be a substrate of any type which is widely used in this field. If an electroconductive substrate is to be used, an insulating film is formed on the surface of the substrate.

The cross sectional shape of the bumping bar 9 along the longitudinal direction of a lead to be formed on the substrate 1 is an arc shape having a smooth upper surface. This bumping bar 9 is preferably a semicylindrical projection extending in the same shape along a direction perpendicular to the lead.

This shape can be obtained in the following manner. If resist is to be used, resist is coated to a predetermined thickness in an elongated pattern, and heated to soften it and fluidize the corners thereof. If low melting glass or refractory metal is to be used instead of resist, the shape can also be obtained through heating and softening. If resist is used, it is thereafter baked to harden it.

Next, a plating underlayer (hereinafter called a probe plating underlayer) is formed on the whole surface of the substrate formed with the bumping bar. In order to improve tight adhesion of the probe underlayer to the substrate, the substrate may be etched by about 10 angstroms by using ion gas, before the underlayer is formed.

Next, a resist mask PR is formed on the substrate to expose the plating underlayer corresponding to the portion where probe leads are to be formed.

The resist mask PR is formed so that the front portion of each probe lead rides on the bumping bar 9. With this setting, the front portion of a probe lead 2 is curved and spaced apart from the substrate at the later process.

Electroplating is performed relative to the surfaces of the exposed probe plating underlayer layer, by using, for example, plating liquid having sulfuric acid as its base composition. The plated layer is therefore grown and leads are formed. Thereafter, the resist mask PR is removed.

The plating underlayer and bumping bar 9 in the area where the leads are not to be formed are removed by milling, resist remover, or ashing. Leads having resilient contact pieces at their front portions and spaced apart from the substrate are therefore formed being juxtaposed on the substrate.

Alternatively, the probe plating underlayer may be formed on the substrate with the bumping bar by using resist only in the areas where the probes are to be formed. Also in this case, the resist mask is formed so that the front portion of each probe lead rides on the bumping bar 9.

In forming the probe plating underlayer, known pattern forming methods can be utilized, such as a method of forming a probe metal layer on the substrate whole surface and pattering it by a photo etching process using resist and a method of printing electroconductive paste on the substrate. There are several methods of forming dots 6 on the distal end portion of the resilient contact piece 3.

Figure 9B:
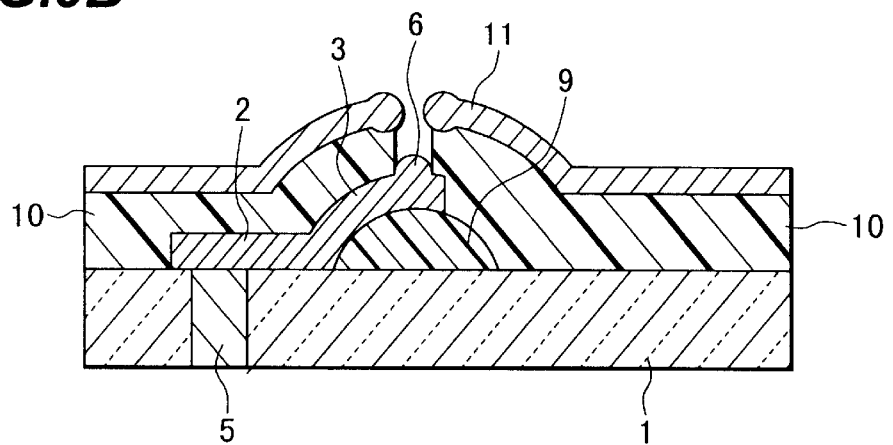

As shown in FIG. 9B, after the leads are formed, a shielding pattern of resist 10 is formed on the substrate in the area where the dots of the resilient contact pieces 3 are not to be formed. Thereafter, metal is sputtered to form dots 6. Instead of sputtering, plating may be used for forming the dots 6.

If metal is sputtered by about 5 $\mu$m, a dot 6 can be formed on the resilient contact piece 3 at the predetermined position. The metal layer 11 is also formed during sputtering on the resist 10. The metal may be the same as the metal of leads, or different metal having a proper rigidity.

Next, the resist 10 is removed by, for example, hot N-methyl-2-pyrrolidone. Resist can be removed more easily by using an ultrasonic vessel.

The resist may be removed by using a plasma ashing system.

If the bumping bar 9 of the substrate is made of resist, this bar 9 can be removed at the same time when the resist removing process is performed. If the bumping bar 9 is made of low melting glass or refractory metal, the bar can be removed by milling and a lead whose front portion is curved and having dots near at the distal end of the lead can be obtained.

Figure 9C:
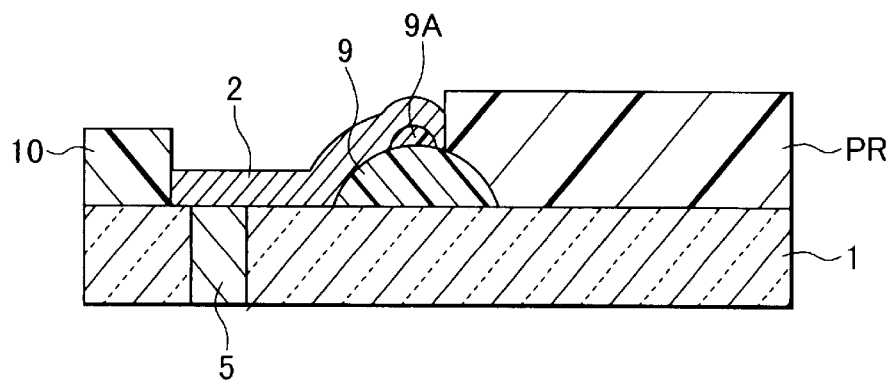

FIG. 9C illustrates a method of forming a lead having a dent under the resilient contact piece. On a semicylindrical bumping bar 9, a small dot 9A having the surface similar to a spherical portion is formed by using resist or the like. Thereafter, similar to FIG. 9A, electroplating is performed to form a lead layer 2. The lead layer having a curved portion and a small dot projecting from the curved portion can be formed, the lead layer having generally the uniform thickness. Thereafter, the resist patterns PR, 9A and 9 are removed.

If a signal (current) flowing through each metal lead is to be picked up from the bottom surface of the substrate by forming a conductive via through the substrate where the metal lead contacts, a plurality of through holes are formed through the substrate at predetermined positions before the bumping bar is formed on the substrate surface.

If the substrate is a ceramic plate, through holes may be formed through the ceramic plate still not baked by using a punching machine, or they may be formed through the baked ceramic plate by $CO_2$ laser or sand blast. If the substrate is a silicon substrate, through holes may be formed by reactive ion etching and thereafter an oxide film is formed on the substrate surface. If the substrate is a metal surface, through holes are formed by a cutting work and thereafter an insulating film is formed on the substrate surface. If the substrate is a chemically cutting type photosensitive glass plate, an ultraviolet ray is applied only to the areas where through holes are to be formed, and after a heat treatment, the substrate is selectively etched by dilute hydrofluoric acid to form through holes.

Next, a metal layer 5 is filled in the through holes by filling metal paste such as copper paste in the through holes. Solvent contained in the metal paste filled in the through hole is evaporated by heating to form the metal layer. When the metal layer is formed, this layer is contracted. By considering this contraction, excessive metal paste is filled in the through hole to such an extent that the metal paste overflows the through hole. The substrate with the metal paste filled in the through hole is heated to change the metal paste layer to a metal layer. Then, the overflowed metal is polished and removed to form the flat surface of the substrate with the metal layer filled in the through hole.

A plated pad of gold or a lamination of gold and platinum may be formed on the bottom of a through hole. In this case, the substrate is covered with a resist pattern exposing the area where the plated pad is to be formed, and gold or gold and platinum are plated to about 4 to 5 $\mu$m to form the plated pad.

If the through hole is not formed, a plated pad may be formed in a manner similar to that described above on the surface of the proximal end portion of the lead on the side opposite to the resilient contact piece.

If an area where the lead is tightly adhered to the substrate is covered with a protective film in order to enhance the tight adhesion between the lead and substrate, photosensitive polyimide, ultraviolet hardening adhesive, cardo type insulating film, photoresist or the like is coated on the lead excepting the plated pad and hardened.

Next, an example of a probe unit manufacturing method according to another embodiment will be described.

FIGS. 10A to 10E are schematic diagrams showing an embodiment of the manufacture method.

Figure 10A:
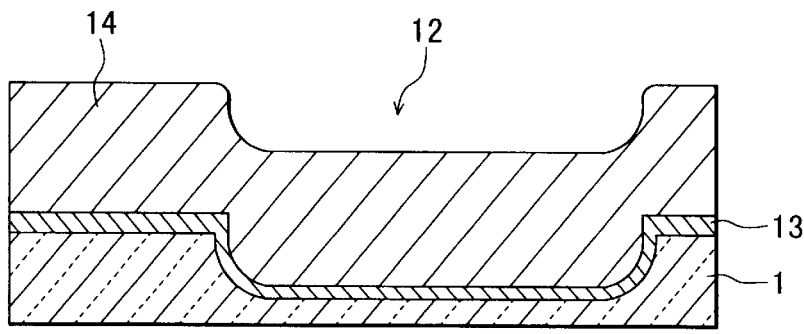
FIGS. 10A, 10B, 10C, 10D and 10E are cross sectional views and a plan view illustrating manufacture processes for probes.

As shown in FIG. 10A, a recess 12 is formed in one surface layer of a substrate 1.

Similar to the above-described embodiments, the substrate may be a substrate of any type which is used widely in this field. If an electroconductive substrate is used, an insulating film is formed on the substrate surface.

It is preferable to form this recess 12 to be parallel to one side of the substrate and straight.

This recess 12 has a predetermined depth and width and extends from one side of the substrate to the opposing side. This recess may traverse the substrate when it is first formed, or a recess is formed extending over the width at least wider than the probe unit and thereafter, the substrate is cut along lines traversing the recess and in parallel to the lead of the probe unit to form the recess which traverses from one side to the other of the cut substrate.

The recess 12 has preferably a depth of 0.05 to 0.3 mm and a width of 0.2 to 5 mm.

Next, a sacrificial film is filled in the recess. The sacrificial film may be made of metal, resin such as epoxy and urethane, and inorganic material such as inorganic salt. An example of the inorganic salt is calcium carbonate.

It is necessary to set the thickness of the sacrificial film 14 thicker than the depth of the recess 12. It is preferable to set the thickness to about 0.05 to 0.4 mm although it depends on the substrate thickness and the recess thickness.

In the following description, it is assumed that the sacrificial layer made of metal is used.

A plating underlayer (hereinafter called a recess plating underlayer) 13 is formed on the whole surface of the substrate on the recess side 12, for example, by sputtering. On this recess plating underlayer, a sacrificial layer 14 is plated. The plated metal is different from the metal of the lead, for example, copper. If copper is used as the metal to be plated, chromium is sputtered to form a tight adhesion layer. On this chromium layer, seed copper may be sputtered. In this specification, the tight adhesion layer and seed sputter layer are collectively called the plating underlayer. The sacrificial layer of metal may be formed directly by electroless plating without using the plating underlayer.

If the sacrificial film is to be made of metal, the cross sectional shape of the recess 12 at both ends thereof is preferably smooth and arc. The diameter R of the arc is preferably greater than the depth of the recess. If the recess has a rectangular shape constituted of the bottom surface and sides, voids may be formed in the sacrificial film 14 filled in the recess having a plated surface, during the plating growth process starting from the bottom surface and sides. If the recess has the end shape which is smooth and arc, voids are not formed in the sacrificial film 14 in the recess 12.

Figure 10B:
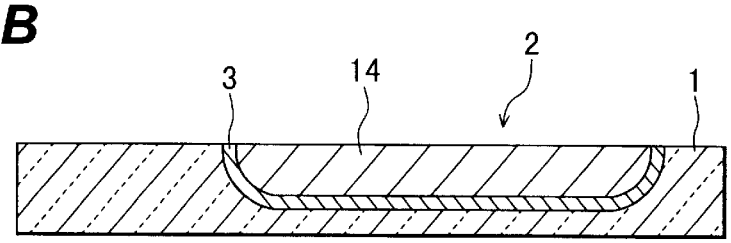

As shown in FIG. 10B, the surface of the plated sacrificial layer 14 is polished to leave the sacrificial layer 14 only in the recess 12 and expose the substrate 1 in the other area. The whole polished surface including the surface of the sacrificial layer is preferably made flat.

Figure 10C:
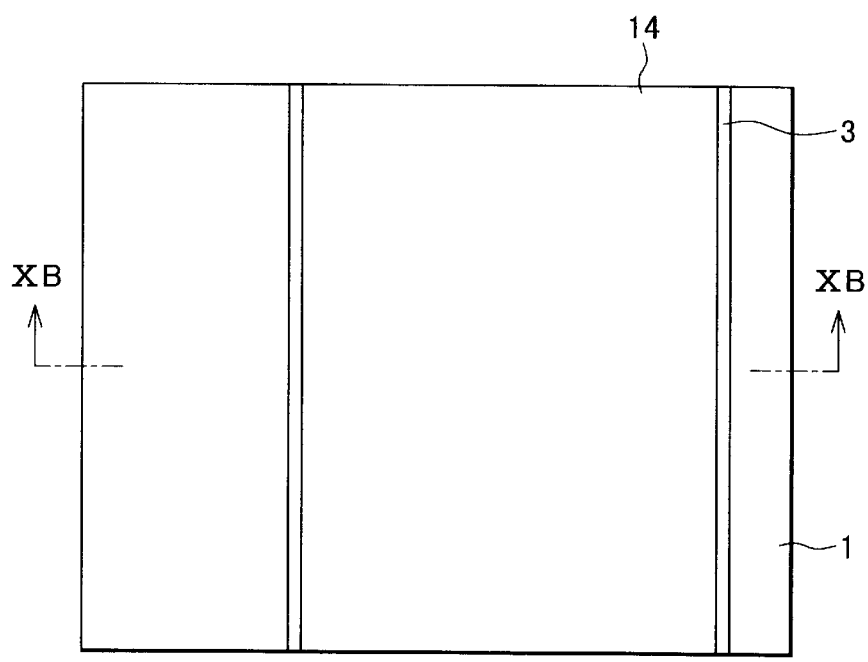

FIG. 10C is a plan view of the substrate surface after polishing.

If the substrate is an electroconductive substrate, after an insulating layer is formed on the substrate surface in the area where the recess is to be formed, the recess is formed in the manner described above, then the recess plating underlayer is formed on the whole substrate surface, and thereafter the sacrificial layer is formed. As the surface of the substrate is polished, the insulating film is exposed in the whole area other than the recess area, and the sacrificial layer is left only in the recess.

If epoxy resin or urethane resin is used as the material of the sacrificial layer, a glass substrate, a ceramic substrate or a metal substrate is used to selectively remove the sacrificial layer at a later process. In this case, the shape of the recess wall is not limited to a particular shape and may be rectangular.

Also in this case, excessive resin is filled in the recess to such an extent that the resin overflows the recess. After the resin is hardened, the substrate is polished to planarize the surface thereof, to leave the resin only in the recess, and to expose the substrate in the other area. For example, if epoxy resin is used, this resin can be hardened by a heat treatment at 150° C. If resin is used as the material of the sacrificial layer, the time required to form the sacrificial layer can be shortened considerably as compared to forming the sacrificial layer by plating.

If inorganic salt such as calcium carbonate is used as the material of the sacrificial layer, inorganic salt powders are filled in the recess without forming voids and dents, pressed and polished to leave the sacrificial layer of inorganic material only in the recess.

Figure 10D:
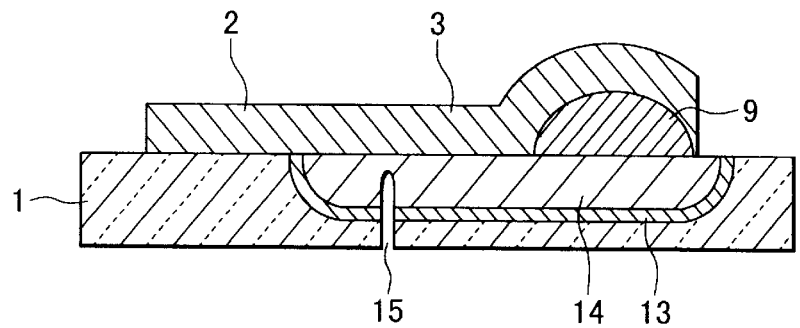

As shown in FIG. 10D, on the sacrificial layer 14, a bumping bar 9 is formed. The cross sectional shape of the bumping bar 9 along the longitudinal direction of leads to be formed on the substrate is an arc shape having a smooth upper surface. The bumping bar 9 traverses the substrate along the direction perpendicular to the lead, exhibiting the same cross sectional shape over the whole length. A dome-shaped projection constituting a portion of a sphere may be formed in the front portion of each lead. The center of the dome-shaped projection may be at the center of the width of each lead front portion or at the position displaced from the lead to raise the side of the lead.

In FIG. 10D, a cut to be formed at a later process is shown, the cut extending from the bottom of the substrate 1 into the sacrificial layer 14.

Next, a probe plating underlayer is formed on the polished surface in an area where the probe lead is to be formed, preferably along the direction perpendicular to the longitudinal direction of the recess 12.

In this case, the probe plating underlayer is formed so that the distal end of the probe plating underlayer corresponding to the distal end of the probe lead is positioned on the dumping bar 9 formed on the sacrificial layer 14, or on the sacrificial layer 14 across the dumping bar 9, and that the remaining lead is positioned only on the substrate on one side of the recess.

If the probe leads are to be formed in parallel at a constant pitch, the probe plating underlayers are juxtaposed at the same pitch.

The probe plating underlayer can be formed by known pattern forming methods, such as a method of forming a metal probe underlayer on the substrate whole surface and pattering it by a photo etching process by using a resist mask and a method of printing conductive paste on the substrate.

The juxtaposed probe plating underlayers are subjected to electroplating by using plating liquid which contains sulfuric acid as its base composition, to thereby grow leads 2.

The thickness of the grown metal lead is preferably about 10 to 80 μm.

Another method of forming the leads may be performed as in the following manner. A probe plating underlayer is formed on the whole surface of the substrate with the bumping bar. Next, a resist pattern is formed to expose the probe plating underlayer only in the areas where the probe leads are to be formed. The exposed probe plating underlayer is subjected to electroplating to grow leads.

The probe plating underlayer in the areas where the leads are not formed and the resist pattern are removed by milling. The leads 2 juxtaposed on the substrate 1 having the metal layer 14 filled in the recess 12 can therefore be obtained.

Figure 10E:
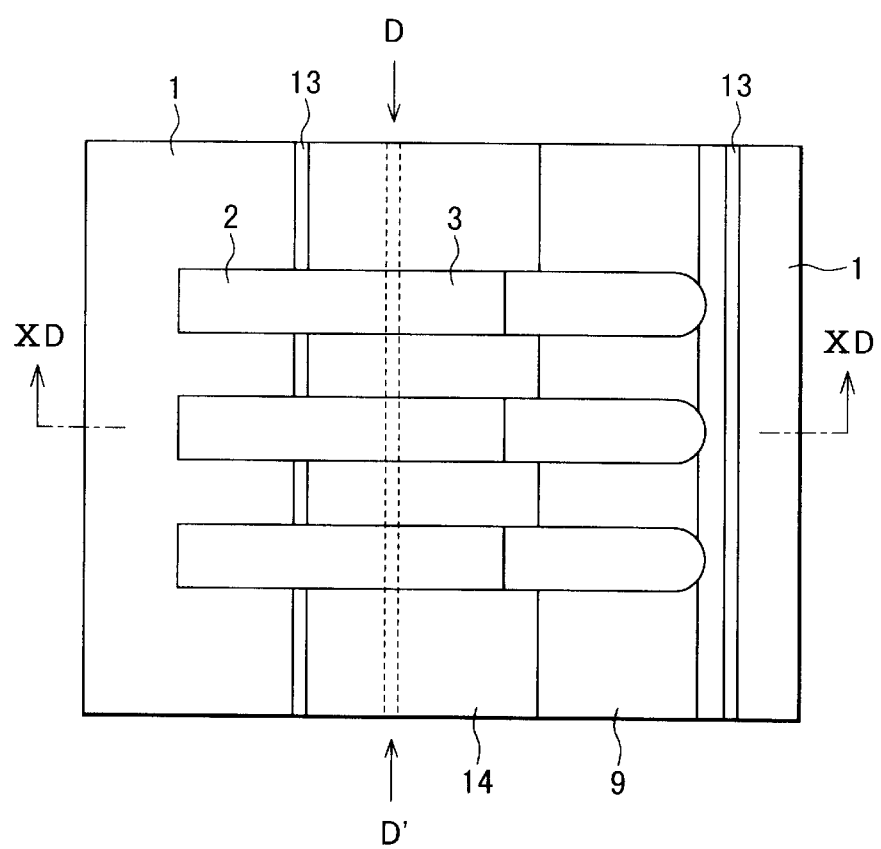

FIG. 10E is a schematic diagram showing this state.

Metal to be plated may be nickel, nickel alloy such as Ni—W and Ni—Fe, or metal glass, which gives proper rigidity and elasticity to each lead.

As shown in FIG. 10D, a cut 15 is formed in parallel to a cross section D–D' from the bottom of the substrate 1 into the sacrificial layer 14. The cut extends over the whole width of the substrate and does not cut the whole sacrificial layer 14. This cut 15 partitions the substrate into two parts. However, the two parts are not separated because they are attached to the sacrificial layer 14 in the recess and the leads 2. Next, as the sacrificial layer 14 and recess plating underlayer 13 are removed by etching, the two parts are separated. The front portion of each lead 2 becomes a resilient contact piece 3 curved and extended from the edge of the substrate as shown in FIGS. 2A and 2B. The other portion is firmly adhered to the substrate. A probe unit having leads juxtaposed at a predetermined pitch can thus be formed.

If a plated pad or protective film is formed on the surface where the lead is in tight contact with the substrate, the process similar to the above-described embodiment is performed.

If a dome-shaped projection is formed at the distal end of each lead and the above-described processes are performed, a probe unit having the dome-shaped projections such as shown in FIGS. 3A and 3B is obtained.

If the dome-shaped projection is formed at such a position that the center of the dome is displaced from the lead and the side of the lead having a portion of the dome is raised, a probe unit such as shown in FIGS. 6A and 6B or FIGS. 7A and 7B can be obtained.

With the manufacture method described above, the cut does not reach the probe lead 2 and a physical force of separating the leads 2 and substrate 1 is not applied. A probe having leads regularly disposed at a fine pitch can be obtained by patterning and plating growth without damaging the probes. Since the curved portion of the probe without edge portions is pushed against the electrode, the electrode is hardly damaged.

The present invention has been described in connection with the preferred embodiments. The invention is not limited only to the above embodiments. It is apparent that various modifications, improvements, combinations, and the like can be made by those skilled in the art.

What we claim are:

1. A probe unit comprising:
    a substrate having an insulated surface; and
    a plurality of metal leads on said insulating surface of said substrate, each said metal lead including a base portion and a resilient contact piece extending from one end of said base portion, said base portion contacting said insulated surface along said base portion's entire length, said resilient contact piece being spaced apart from said insulated surface along said contact piece's entire length, said resilient contact piece having a cross section taken along a plane which is perpendicular to said insulated surface and which defines a smooth arcuate shape over substantially said entire length of said resilient contact piece.

2. A probe according to claim 1, further comprising a small projection formed on a surface of said resilient contract piece on a side of said resilient contact piece facing opposite to said substrate near at a distal end of said resilient contact piece.

3. A probe unit according to claim 1, wherein an arcuate bump is located near the distal end of said resilient contact piece.

4. A probe unit according to claim 1, further comprising through holes formed through said substrate at positions where said substrate contacts said metal leads, and wherein via conductors filled said through holes.

5. A probe unit according to claim 1, said resilient contact piece has a thickness which is generally uniform over its entire length.

6. A probe unit according to claim 1, wherein said metal leads are regularly juxtaposed on said insulated surface.

7. A probe unit comprising:
    a substrate having an insulated surface:
        a plurality of metal leads regularly juxtaposed on said insulated surface of said substrate, each said metal lead having a resilient contact piece having a width W in a front portion of said lead, the resilient contact piece extending over an edge of said substrate; and
        a projection formed in said resilient contact piece at a distal end thereof, said projection extending in a direction away from said substrate and having a surface shape constituting a portion of a sphere, said projection having a length 2R, wherein 2R>W.

8. A probe unit comprising:
    a substrate having an insulated surface:
        a plurality of metal leads regularly juxtaposed on the insulated surface of said substrate, said metal lead having a resilient contact piece in a front portion of said lead, the resilient contact piece extending over an edge of said substrate; and
        a plurality of small projections formed on a surface of the resilient contact piece near at a distal end thereof on a side opposite to said substrate, said small projections having the same shape.

9. A probe unit according to claim 8, wherein said small projection has a surface shape constituting a portion of a spherical surface.

10. A probe unit according to claim 8, wherein said small projection has a surface shape constituting a portion of a cylindrical surface.

11. A probe unit comprising:
    a substrate having an insulated surface:
        a plurality of metal leads regularly juxtaposed on the insulated surface of said substrate, said metal lead having a resilient contact piece in a front portion of said lead, the resilient contact piece extending over an edge of said substrate; and
        two projections formed on a surface of the resilient contact piece near at a distal end thereof, in symmetry with a center line of said metal lead along a longitudinal direction thereof, said two projections becoming higher at a position nearer to the edge of the resilient contact piece and having a shape that the projections become higher and skirts of the projections become nearer, from the distal end to a side of said substrate at least up to an intermediate position.

12. A probe unit according to claim 11, wherein the resilient contact piece has a shape which has a shape of the skirts of said two projections in an area from the distal end to a position where the two projections become nearest and a U-character shaped retracted shape between the two projections.

13. A method of manufacturing a probe unit comprising:
a bumping bar on one surface of a substrate, said bumping bar having a curved surface, a cross section of said curved surface lying perpendicular to said surface of said substrate having the shape of a smooth arc;
forming leads on said surface of said substrate, a distal end of each lead riding on said bumping bar, so that a portion of each lead riding on said bumping bar is curved in a smooth shape; and
removing said bumping bar after said leads are formed.

14. A method of manufacturing a probe unit comprising:
a step of preparing a substrate having a recess formed in a surface layer:
a step of forming a sacrificial filled in the recess;
a step of forming a bumping bar having a predetermined pattern on the sacrificial layer:
a step of forming leads on a surface of the substrate, a distal end of each lead riding on the bumping bar;
a step of forming a cut extending from a bottom of the substrate into the sacrificial layer; and
a step of etching and removing the sacrificial layer and bumping bar.

* * * * *